United States Patent
Zhu et al.

(10) Patent No.: US 12,278,228 B2
(45) Date of Patent: Apr. 15, 2025

(54) FLEXIBLE DISPLAY PANEL AND SLIDING AND ROLLING DISPLAY APPARATUS

(71) Applicant: BOE TECHNOLOGY GROUP CO., LTD., Beijing (CN)

(72) Inventors: Hong Zhu, Beijing (CN); Lu Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/927,609

(22) PCT Filed: Nov. 2, 2021

(86) PCT No.: PCT/CN2021/128238
§ 371 (c)(1),
(2) Date: Nov. 23, 2022

(87) PCT Pub. No.: WO2022/252493
PCT Pub. Date: Dec. 8, 2022

(65) Prior Publication Data
US 2024/0258289 A1    Aug. 1, 2024

(30) Foreign Application Priority Data

May 31, 2021  (CN) .......................... 202110605564.8

(51) Int. Cl.
*H01L 25/16* (2023.01)
*H01L 27/15* (2006.01)
(Continued)

(52) U.S. Cl.
CPC .......... *H01L 25/167* (2013.01); *H01L 27/156* (2013.01); *H01L 33/52* (2013.01); *H01L 33/58* (2013.01)

(58) Field of Classification Search
CPC ............ G02F 1/133345; G02F 1/1333; H10K 59/131; H10K 59/873; H10K 59/122;
(Continued)

(56) References Cited

U.S. PATENT DOCUMENTS 9,997,730 B2* 6/2018 Nishimura ........... H10K 59/122
11,385,684 B2* 7/2022 Kwon ................... G06F 1/1624
(Continued)

FOREIGN PATENT DOCUMENTS

| CN | 109887935 A | 6/2019 |
| CN | 110556411 A | 12/2019 |

(Continued)

OTHER PUBLICATIONS

PCT International Search Report (w/ English translation) and Written Opinion for corresponding PCT Application No. PCT/CN2021/128238, mailed Feb. 23, 2022, 13 pages.

*Primary Examiner* — Xuemei Zheng
(74) *Attorney, Agent, or Firm* — Dority & Manning, P.A.

(57) ABSTRACT

A flexible display panel has a display area, a bezel area disposed around the display area and a sliding and rolling connection area connected to a first border of the bezel area away from the display area. The flexible display panel includes a base substrate covering at least the display area and the bezel area and one or more inorganic insulating layers located on a side of the base substrate. A total thickness of a portion of the one or more inorganic insulating layers located in the sliding and rolling connection area is less than a total thickness of a portion of the one or more inorganic insulating layers located in the display area.

20 Claims, 7 Drawing Sheets

(51) Int. Cl.
    *H01L 33/52*    (2010.01)
    *H01L 33/58*    (2010.01)
(58) Field of Classification Search
    CPC .... H10K 77/111; H10K 50/844; H10K 50/84;
        H10K 2102/311; H10K 2102/351; H01L
        25/167; H01L 27/156; H01L 33/52; H01L
                                            33/58
    See application file for complete search history.

(56)             References Cited

U.S. PATENT DOCUMENTS

| | | | |
|---|---|---|---|
| 2017/0092708 | A1 | 3/2017 | Jeon |
| 2017/0179432 | A1* | 6/2017 | Visweswaran ..... H10K 59/1213 |
| 2018/0182829 | A1 | 6/2018 | Shin et al. |
| 2019/0103569 | A1 | 4/2019 | Zhai et al. |
| 2019/0181378 | A1 | 6/2019 | Song et al. |
| 2020/0161569 | A1 | 5/2020 | Yu et al. |
| 2020/0214149 | A1 | 7/2020 | Lee et al. |
| 2020/0243574 | A1 | 7/2020 | Tian et al. |
| 2021/0014982 | A1 | 1/2021 | Bok et al. |
| 2021/0031491 | A1* | 2/2021 | Du ............................ B32B 7/12 |
| 2021/0074189 | A1 | 3/2021 | Kwon et al. |
| 2021/0165527 | A1* | 6/2021 | Kim ...................... G06F 3/0445 |
| 2022/0100023 | A1 | 3/2022 | Wang et al. |
| 2022/0386485 | A1 | 12/2022 | Dong |
| 2023/0292561 | A1* | 9/2023 | Okabe ................ H10K 59/1201 |

FOREIGN PATENT DOCUMENTS

| | | |
|---|---|---|
| CN | 110992836 A | 4/2020 |
| CN | 215577412 U | 1/2022 |

* cited by examiner

FLEXIBLE DISPLAY PANEL AND SLIDING AND ROLLING DISPLAY APPARATUS

CROSS-REFERENCE TO RELATED APPLICATIONS

This application is a national phase entry under 35 USC 371 of International Patent Application No. PCT/CN2021/128238, filed on Nov. 2, 2021, which claims priority to Chinese Patent Application No. 202110605564.8, filed on May 31, 2021, which are incorporated herein by reference in their entirety.

TECHNICAL FIELD

The present disclosure relates to the field of display technologies, and in particular, to a flexible display panel and a method of manufacturing the same, and a sliding and rolling display apparatus.

BACKGROUND

With the development of flexible display technologies, application forms such as a curved screen having a constant curvature, a folding screen, a wristband and a curling screen emerge endlessly, which injects new vitality into the design of flexible display screens.

The sliding and rolling display technology is another new display mode after the folding display mode. The sliding and rolling display technology causes an expansion of a screen to be changed from two display states to a plurality of display states. In a process of pulling out the screen from a shaft, the display screen is expanded like a painting scroll, which does not interrupt the continuous experience of a user in the process of expanding the screen and has strong senses of fashion and science and technology, thereby bringing better visual experience and usage experience to the user.

SUMMARY

In an aspect, a flexible display panel is provided. The flexible display panel has a display area, a bezel area disposed around the display area and a sliding and rolling connection area connected to a first border of the bezel area away from the display area. The flexible display panel includes a base substrate and one or more inorganic insulating layers. The base substrate covers at least the display area and the bezel area. The one or more inorganic insulating layers are located on a side of the base substrate. A total thickness of a portion of the one or more inorganic insulating layers located in the sliding and rolling connection area is less than a total thickness of a portion of the one or more inorganic insulating layers located in the display area.

In some embodiments, in the flexible display panel, a number of layers of the portion of the one or more inorganic insulating layers located in the sliding and rolling connection area is less than a number of layers of the portion of the one or more inorganic insulating layers located in the display area.

In some embodiments, the flexible display panel includes a display functional layer located on the side of the base substrate and an encapsulation layer located on a side of the display functional layer away from the base substrate. The encapsulation layer is configured to encapsulate the display functional layer on the base substrate. The display functional layer and the encapsulation layer include at least one inorganic insulating layer of the one or more inorganic insulating layers, and the at least one inorganic insulating layer is located only on a side of the first border proximate to the display area.

In some embodiments, the base substrate further covers the sliding and rolling connection area.

In some embodiments, the flexible display panel further includes: a back film located on a side of the base substrate away from the display functional layer, the back film covering at least the display area and the bezel area; a polarizer located on a side of the display functional layer and the encapsulation layer away from the base substrate, the polarizer covering at least the display area and the bezel area; and an optical adhesive layer located on a side of the polarizer away from the display functional layer and the encapsulation layer, the optical adhesive layer covering at least the display area and the bezel area.

In some embodiments, the base substrate covers only the display area and the bezel area. The flexible display panel further includes a level difference filling layer contiguous with both of the base substrate and the encapsulation layer, and the level difference filling layer covers the sliding and rolling connection area.

In some embodiments, the flexible display panel further includes: a back film located on a side of the base substrate away from the display functional layer, the back film covering at least the display area and the bezel area; a polarizer located on a side of the display functional layer and the encapsulation layer away from the base substrate, the polarizer covering at least the display area and the bezel area; and an optical adhesive layer located on a side of the polarizer away from the display functional layer and the encapsulation layer, the optical adhesive layer covering at least the display area and the bezel area.

In some embodiments, the back film covers only the display area and the bezel area; the level difference filling layer is further contiguous with the back film.

In some embodiments, the polarizer covers only the display area and the bezel area; the level difference filling layer is further contiguous with the polarizer.

In some embodiments, the back film further covers the sliding and rolling connection area; the polarizer covers only the display area and the bezel area; the level difference filling layer is further contiguous with the polarizer.

In some embodiments, the optical adhesive layer covers only the display area and the bezel area; the level difference filling layer is further contiguous with the optical adhesive layer.

In some embodiments, an elastic modulus of the level difference filling layer is less than an elastic modulus of all film layer structures, as a whole, contiguous with a side of the level difference filling layer proximate to the display area.

In some embodiments, the level difference filling layer includes at least one layer of optical adhesive and/or at least one layer of organic plastic.

In some embodiments, the flexible display panel further includes: a supporting member located on a side of a back film away from the base substrate, the supporting member covering the display area, the bezel area and the sliding and rolling connection area; and a protective cover plate located on a side of an optical adhesive layer away from a polarizer, the protective cover plate covering the display area, the bezel area and the sliding and rolling connection area.

In some embodiments, the display functional layer includes a circuit structure layer located on the side of the base substrate and located on a side of the first border proximate to the display area and a light-emitting structure layer located on a side of the circuit structure layer away from the base substrate. The light-emitting structure layer covers at least the display area, and the light-emitting structure layer is coupled to the circuit structure layer. The circuit structure layer includes an inorganic insulating layer of the at least one inorganic insulating layer.

In some embodiments, the flexible display panel further includes a blocking dam structure located in the bezel area and disposed around the circuit structure layer and the light-emitting structure layer. The encapsulation layer includes another inorganic insulating layer of the at least one inorganic insulating layer, and the another inorganic insulating layer covers the blocking dam structure.

In another aspect, a sliding and rolling display apparatus is provided. The sliding and rolling display apparatus includes a first sliding and rolling shaft and the flexible display panel as described in any one of the above embodiments. A portion of the flexible display panel is wound on a portion of the first sliding and rolling shaft in a direction perpendicular to the first border; when the flexible display panel is in a maximum expanded state, at least a portion, located in the sliding and rolling connection area, of the flexible display panel is in contact with the first sliding and rolling shaft.

In some embodiments, when the flexible display panel is in the maximum expanded state, a surface of the first sliding and rolling shaft wrapped by the flexible display panel includes a first cambered surface and a second cambered surface that are connected to each other in a circumferential direction of the first sliding and rolling shaft, the first cambered surface is closer to the display area of the flexible display panel than the second cambered surface, and a radian of the first cambered surface is less than or equal to a radian of the second cambered surface. When the flexible display panel is in the maximum expanded state, an orthogonal projection of the first border of the bezel area on a circumferential surface of the first sliding and rolling shaft is located in the first cambered surface.

In some embodiments, when the flexible display panel is in the maximum expanded state, an orthogonal projection of a border, proximate to the first border, of the display area on the circumferential surface of the first sliding and rolling shaft is located in the first cambered surface.

In some embodiments, the radian of the first cambered surface is equal to the radian of the second cambered surface.

In some embodiments, the sliding and rolling display apparatus further includes a fixed shaft parallel to the first sliding and rolling shaft; a portion of the flexible display panel is wound and fixed on a portion of the fixed shaft in the direction perpendicular to the first border. The flexible display panel further has a fan-out area connected to a second border of the bezel area away from the sliding and rolling connection area; at least a portion, located in the fan-out area, of the flexible display panel is in contact with the fixed shaft.

In some embodiments, the sliding and rolling display apparatus further includes a second sliding and rolling shaft parallel to the first sliding and rolling shaft; a portion of the flexible display panel is wound on a portion of the second sliding and rolling shaft in the direction perpendicular to the first border. The flexible display panel further has a fan-out area connected to a second border of the bezel area away from the sliding and rolling connection area; when the flexible display panel is in the maximum expanded state, at least a portion, located in the fan-out area, of the flexible display panel is in contact with the second sliding and rolling shaft.

In some embodiments, the sliding and rolling display apparatus further includes a frame located on a non-display side of the flexible display panel; when the flexible display panel is in the maximum expanded state, the frame covers at least a structure, located in both of the sliding and rolling connection area and the bezel area, of the flexible display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods, and actual timings of signals involved in the embodiments of the present disclosure.

DETAILED DESCRIPTION

Figure 1:
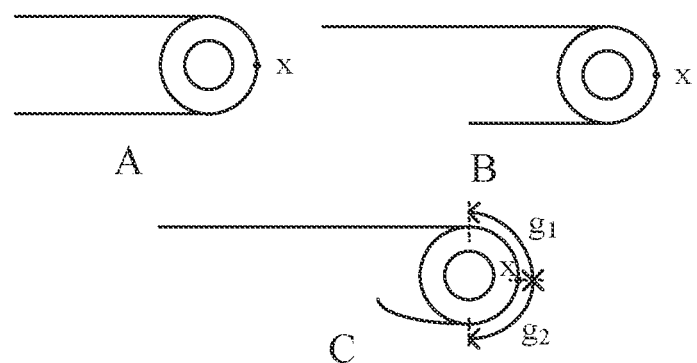
FIG. 1 is a diagram showing sectional structures, in different states, of a sliding and rolling display module in the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B. and a combination of A and B.

As used herein, according to the context, the term "A covers B" may refer to that borders of orthographic projections of A and B on a cover plate are identical, or may refer to that a distance between adjacent borders of the orthographic projections of A and B on the cover plate is within 0.5 mm.

The phrase "applicable to" or "configured to" as used herein indicates an open and inclusive expression, which does not exclude devices that are applicable to or configured to perform additional tasks or steps.

As used herein, the term "about" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

At present, it is one of the research trends in the field how to ensure flatness of a flexible screen in a sliding and rolling display apparatus, so as to improve the visual effect and the satisfaction of a user. Thus, it is required that film layers in a bending region each have an ability to be bend and ensured that all the film layers in the bending region do not break or separate from each other during bending.

Referring to FIG. 1, in the related art, a sliding and rolling display module has a rolled-up state A as shown in FIG. 1 and an expanded state B as shown in FIG. 1. On this basis, the inventors of the present disclosure have found by researching that when the sliding and rolling display module is in a maximum expanded state C as shown in FIG. 1 or approaches the maximum expanded state C, a width of an end of a flexible display panel thereof is small, so that the end is prone to tilt up; furthermore, under a reliability condition, the end of the flexible display panel that tilts up may apply a tensile force to a bending position of the flexible display panel, and the tensile force may be gradually transmitted to other positions of the flexible display panel; since the tensile force may be firstly transmitted to a lower half $g_2$ of the bending region of the flexible display panel, and a part of the tensile force may be absorbed by the flexible display panel during the transmission, the tensile force reaching an upper half $g_1$ of the bending region may be reduced. It will be seen from the above that maximum strain of key film layers in the sliding and rolling display module occurs in the lower half $g_2$ of the bending region of the flexible display panel, which makes inorganic layers in this region prone to break, thereby causing an encapsulation failure. As a result, moisture and oxygen rapidly invade, which causes peeling of a light-emitting layer and black screen of the flexible display panel, i.e., a display failure of the entire flexible display panel; in addition, touchdown of a top end x of a sliding and rolling shaft also directly causes the encapsulation failure of the sliding and rolling display module at a position where the top end x is located, which is also a situation that the failure is extremely prone to occur. The phrases "upper" and "lower" respectively in the "upper half $g_1$" and the "lower half $g_2$" are schematic described by taking FIG. 1 as an example, and refer to two opposite directions in FIG. 1, and are not fixed directions in space.

Figure 2:
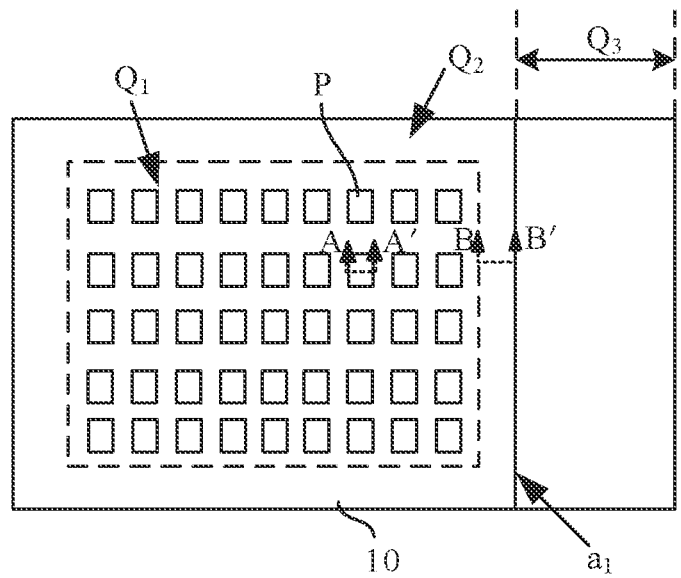
FIG. 2 is a top view of a flexible display panel, in accordance with some embodiments of the present disclosure.
Figure 3:
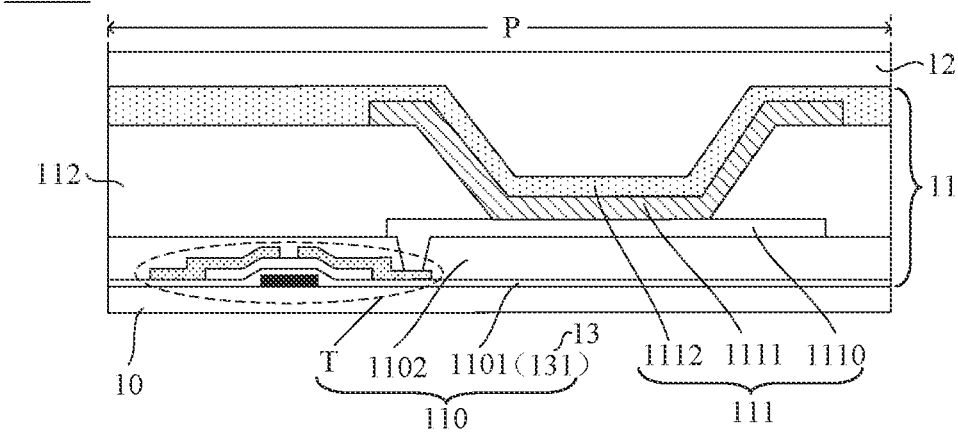
FIG. 3 is a diagram showing a sectional structure of the flexible display panel in FIG. 2 taken along the line A-A'.

In light of this, some embodiments of the present disclosure provide a flexible display panel 100, referring to FIG. 2, the flexible display panel 100 has a display area $Q_1$, a bezel area $Q_2$ disposed around the display area $Q_1$ and a sliding and rolling connection area $Q_3$ connected to a first border $a_1$ of the bezel area $Q_2$ away from the display area $Q_1$. As shown in FIG. 3, the flexible display panel 100 includes a base substrate 10 and at least one inorganic insulating layer 13.

The base substrate 10 covers at least the display area $Q_1$ and the bezel area $Q_2$. The at least one inorganic insulating layer 13 is located on a side of the base substrate 10. A total thickness of a portion of the inorganic insulating layer(s) 13 located in the sliding and rolling connection area $Q_3$ is less than a total thickness of a portion (e.g., represented by 131 in FIG. 3) of the inorganic insulating layer(s) 13 located in the display area $Q_1$.

A material of the base substrate 10 includes a flexible material. For example, the flexible material may be at least one of polyimide (PI) and polyethylene terephthalate (PET).

For example, the total thickness of the portion of the inorganic insulating layer(s) 13 located in the sliding and rolling connection area $Q_3$ may be 0 μm.

It will be noted that implementations of the above description that "the total thickness of the portion of the inorganic insulating layer(s) 13 located in the sliding and rolling connection area $Q_3$ is less than the total thickness of the portion of the inorganic insulating layer(s) 13 located in the display area $Q_1$" include, but are not limited to, reducing the number of layers of the portion of the inorganic insulating layer(s) 13 located in the sliding and rolling connection area $Q_3$, and/or reducing a thickness of any inorganic insulating layer 13 or each of inorganic insulating layers located in the sliding and rolling connection area $Q_3$.

In the flexible display panel 100 provided in some embodiments of the present disclosure, when a sliding and rolling display module is in a maximum expanded state, most of the sliding and rolling connection area $Q_3$ is located in a maximum strain region (e.g., the lower half $g_2$ mentioned above) of the flexible display panel 100, and thus by setting the total thickness of the portion of the inorganic insulating layer(s) 13 located in the sliding and rolling connection area $Q_3$ to be less than the total thickness of the portion of the inorganic insulating layer(s) 13 located in the display area $Q_1$, a total thickness of a portion of the inorganic insulating layer(s) 13 covering the maximum strain region may be reduced as much as possible without affecting the display effect of the flexible display panel 100, so that an elastic modulus of the portion of the inorganic insulating layer(s) 13 in the maximum strain region may be reduced, and the portion of the inorganic insulating layer(s) 13 located in the maximum strain region may be prevented from breaking due to pulling as much as possible. As a result, it is helpful to ameliorate problems of encapsulation failure, rapid invasion of moisture and oxygen and easy peeling of a light-emitting layer, so that black screen of the flexible display panel 100 is not prone to occur during the display period. That is, a probability of occurrence of the display failure of the entire flexible display panel 100 is reduced.

In some embodiments, the number of layers of the portion of the inorganic insulating layer(s) 13 located in the sliding and rolling connection area $Q_3$ is less than the number of layers of the portion of the inorganic insulating layer(s) 13 located in the display area $Q_1$.

With this design, by reducing the number of layers of the portion of the inorganic insulating layer(s) 13 located in the sliding and rolling connection area $Q_3$, the thickness of the portion of the inorganic insulating layer(s) 13 covering the maximum strain region may be reduced as much as possible, and a method of manufacturing the flexible display panel 100 is simplified. Moreover, since the number of layers of the portion of the inorganic insulating layer(s) 13 located in the sliding and rolling connection area $Q_3$ is reduced, it is helpful to further ameliorate a problem that the portion of the inorganic insulating layer(s) 13 located in the maximum strain region (e.g., the lower half $g_2$ mentioned above) are prone to break.

For example, the number of layers of the portion of the inorganic insulating layer(s) 13 located in the sliding and rolling connection area $Q_3$ may be zero.

In some examples, a total thickness of a portion of the inorganic insulating layer(s) 13 located in the bezel area $Q_2$ is less than or equal to the total thickness of the portion of the inorganic insulating layer(s) 13 located in the display area $Q_1$, and is greater than the total thickness of the portion of the inorganic insulating layer(s) 13 located in the sliding and rolling connection area $Q_3$.

In some examples, the number of layers of the portion of the inorganic insulating layer(s) 13 located in the bezel area $Q_2$ is less than or equal to the number of layers of the portion of the inorganic insulating layer(s) 13 located in the display area $Q_1$, and is greater than the number of layers of the portion of the inorganic insulating layer(s) 13 located in the sliding and rolling connection area $Q_3$.

In some embodiments, with continued reference to FIGS. 2 and 3, the flexible display panel 100 further includes a display functional layer 11 and an encapsulation layer 12.

The display functional layer 11 is located on the side of the base substrate 10. The encapsulation layer 12 is located on a side of the display functional layer 11 away from the base substrate 10, and the encapsulation layer 12 is configured to encapsulate the display functional layer 11 on the base substrate 10.

The display functional layer 11 and the encapsulation layer 12 include at least one inorganic insulating layer 13, and the at least one inorganic insulating layer 13 is located on a side of the first border $a_1$ proximate to the display area $Q_1$.

Here, it will be noted that a description that "the display functional layer 11 and the encapsulation layer 12 include the at least one inorganic insulating layer 13" may refer to that only the display functional layer 11 includes the at least one inorganic insulating layer 13, or only the encapsulation layer 12 includes the at least one inorganic insulating layer 13, or the display functional layer 11 and the encapsulation layer 12 each include at least one inorganic insulating layer 13. Correspondingly, the at least one inorganic insulating layer 13 located on the side of the first border $a_1$ proximate to the display area $Q_1$ may be the at least one inorganic insulating layer 13 included in the display functional layer 11, or the at least one inorganic insulating layer 13 included in the encapsulation layer 12, or the at least one inorganic insulating layer 13 included in each of the display functional layer 11 and the encapsulation layer 12.

A single inorganic insulating layer 13 is taken as an example, and it will be understood that in a case where the single inorganic insulating layer 13 is located on the side of the first border $a_1$ proximate to the display area $Q_1$, the single inorganic insulating layer 13 does not cover the sliding and rolling connection area $Q_3$. On this basis, in a case where the inorganic insulating layer(s) 13 included in the display functional layer 11 and the encapsulation layer 12 are located on the side of the first border $a_1$ proximate to the display area $Q_1$, the inorganic insulating layer(s) 13 included in the display functional layer 11 and the encapsulation layer 12 each do not cover the sliding and rolling connection area $Q_3$.

In addition, it is worth noting that in the flexible display panel 100 provided in the embodiments of the present disclosure, in addition to the least one inorganic insulating layer 13 included in the display functional layer 11 and the encapsulation layer 12, the inorganic insulating layer(s) 13 in the flexible display panel 100 may further be disposed in another functional layer such as a touch functional layer.

The flexible display panel 100 has the display area $Q_1$, the bezel area $Q_2$ and the sliding and rolling connection area $Q_3$. As shown in FIG. 2, the display area $Q_1$ includes a plurality of sub-pixel regions P, the plurality of sub-pixel regions P may include, for example, red sub-pixel regions, green sub-pixel regions and blue sub-pixel regions.

For example, the display functional layer 11 includes a plurality of light-emitting devices, and the plurality of light-emitting devices are respectively located in the plurality of sub-pixel regions P. The plurality of light-emitting devices emit light, so that the display of images may be achieved in the display area $Q_1$.

The bezel area $Q_2$ may be provided with structures such as dummy pixel(s), peripheral driving circuit(s), peripheral signal line(s) and blocking dam(s). Borders of the display functional layer 11 and the encapsulation layer 12 may be located in the bezel area $Q_2$.

Figure 4:
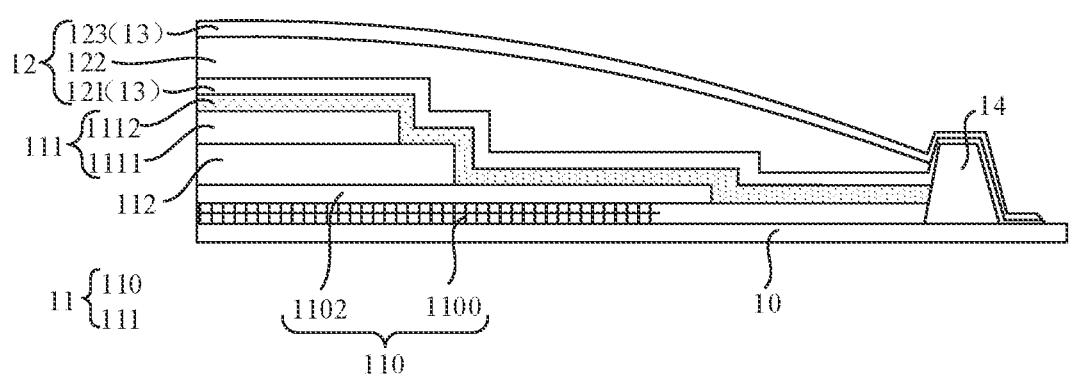
FIG. 4 is a diagram showing a sectional structure of the flexible display panel in FIG. 2 taken along the line B-B'.

In some examples, referring to FIGS. 3 and 4, the display functional layer 11 includes a circuit structure layer 110 and a light-emitting structure layer 111.

The circuit structure layer 110 is located on the side of the base substrate 10 and located on the side of the first border $a_1$ proximate to the display area $Q_1$.

For example, the circuit structure layer 110 includes a plurality of pixel circuits, gate driving circuit(s), at least one signal line (e.g., a voltage source source (VSS) signal line 1100 in FIG. 4), etc.

The plurality of pixel circuits are respectively located in the plurality of sub-pixel regions P. As shown in FIG. 3, each pixel circuit includes at least a driving transistor T, and the driving transistor T includes a source, a drain, an active layer and a gate.

As shown in FIG. 4, the VSS signal line 1100 is located in the bezel area $Q_2$ and disposed around the display area $Q_1$.

The gate driving circuit(s) (i.e., gate driver(s) on array (GOA(s))) are located in the bezel area $Q_2$ (for example, which may be respectively located on both sides of the bezel area $Q_2$ in a direction parallel to the first side border $a_1$ in FIG. 2), and are used to provide a gate scanning signal for the pixel circuit. For example, the gate driving circuit(s) may each include, for example, a light-emitting control (EM) GOA and at least one group of Gate GOAs. The EM GOA outputs an EM signal, and the Gate GOA outputs a gate scanning signal.

The light-emitting structure layer 111 is located on a side of the circuit structure layer 110 away from the base substrate 10, and the light-emitting structure layer 111 covers at least the display area $Q_1$. For example, as shown in FIGS. 3 and 4, the light-emitting structure layer 111 includes an anode layer 1110, a light-emitting functional layer 1111 and a cathode layer 1112 that are sequentially arranged in a stack in a direction away from the base substrate 10.

The light-emitting functional layer 1111 includes at least the light-emitting layer. In some examples, in addition to the light-emitting layer, the light-emitting functional layer 1111 further includes at least one of an electron transporting layer, an electron injection layer, a hole transporting layer and a hole injection layer.

For example, the light-emitting structure layer 111 may be divided into the plurality of light-emitting devices, and each light-emitting device includes an anode, a light-emitting portion and a cathode that are arranged in a stack. The anodes constitute the anode layer 1110, the light-emitting portions constitute the light-emitting functional layer 1111, and the cathodes constitute the cathode layer 1112.

It is worth pointing out that the light-emitting functional layer 1111 may include a plurality of block structures, or may be of a whole-layer structure. Similarly, the cathode layer 1112 may include a plurality of block structures, or may be of a whole-layer structure.

A light-emitting device in the light-emitting structure layer 111 is located in a sub-pixel region P and coupled to a pixel circuit; the pixel circuit is configured to drive the light-emitting device coupled thereto to emit light to achieve the display of images. For example, the anode of the light-emitting device may be coupled to the source or the drain of the driving transistor T in the pixel circuit, and the cathode of the light-emitting device may be coupled to the VSS signal line 1100, so that a driving current may flow through the light-emitting device to drive the light-emitting device to emit light.

For example, the VSS signal line 1100 may be disposed in the same layer as the source and the drain of the driving transistor T.

It will be noted that, the "same layer" refers to a layer structure formed by using the same film forming process to form a film layer for forming specific patterns, and then performing a single patterning process on the film layer by using the same mask. Depending on different specific patterns, the single patterning process may include several exposure, development or etching processes, the specific patterns in the formed layer structure may be continuous or discontinuous, and these specific patterns may also be at different heights or have different thicknesses.

For example, as shown in FIG. 3, the circuit structure layer 110 further includes a gate insulating layer 1101 located between the gate of the driving transistor T and the active layer of the driving transistor T, and the gate insulating layer 1101 is the inorganic insulating layer 13. The gate insulating layer 1101 does not cover the sliding and rolling connection area Q₃. That is, the gate insulating layer 1101 is located on the side of the first border a₁ proximate to display area Q₁.

It will be noted that the gate insulating layer 1101 is only an example for description, and it will be understood that, in other examples, the circuit structure layer 110 may further include other inorganic insulating layers 13 such as a passivation layer.

For example, as shown in FIGS. 3 and 4, the circuit structure layer 110 further includes a planarization layer 1102. The planarization layer 1102 is located between the driving transistor T and the light-emitting structure layer 111, the planarization layer 1102 extends from the display area Q₁ to the bezel area Q₂, and a border of the planarization layer 1102 is located in the bezel area Q₂. The anode located in the sub-pixel region P is connected to the drain of the driving transistor T through a via hole provided in the planarization layer 1102.

For example, as shown in FIGS. 3 and 4, the display functional layer 11 further includes a pixel definition layer 112, and the pixel definition layer 112 is located on a side of the planarization layer 1102 away from the base substrate 10. The pixel definition layer 112 may extend from the display area Q₁ to the bezel area Q₂, and a border of the pixel definition layer 112 is located in the bezel area Q₂. The pixel definition layer 112 has openings for accommodating the plurality of light-emitting devices.

With continued reference to FIG. 4, in some examples, the encapsulation layer 12 includes a first inorganic barrier layer 121, an organic barrier layer 122 and a second inorganic barrier layer 123 that are arranged in a stack.

On this basis, for example, as shown in FIG. 4, the flexible display panel 100 further includes at least one blocking dam structure 14 disposed in a circle. The blocking dam structure 14 is located in the bezel area Q₂ and disposed around the circuit structure layer 110 and the light-emitting structure layer 111.

The organic barrier layer 122 is located on a side of the blocking dam structure 14 proximate to the display area. The first inorganic barrier layer 121 and the second inorganic barrier layer 123 both cover the blocking dam structure 14.

In the above example, the first inorganic barrier layer 121 and the second inorganic barrier layer 123 each have a function of blocking moisture and oxygen, and the organic barrier layer 122 has certain flexibility, so that the formed encapsulation layer 12 may achieve a good encapsulation effect on the flexible display panel 100, and a phenomenon of encapsulation leakage is not prone to occur. By providing the blocking dam structure 14, in a process of forming the organic barrier layer 122, the blocking dam structure 14 may be used to block a material for forming the organic barrier layer 122 to prevent the material from overflowing outside a region surrounded by the blocking dam structure 14, which is conducive to ensuring an encapsulation reliability.

The first inorganic barrier layer 121 and the second inorganic barrier layer 123 may be the inorganic insulating layers 13 in the flexible display panel 100. That is, in some examples, the inorganic insulating layers 13 in the flexible display panel 100 may be located in the encapsulation layer 12.

In the flexible display panel 100 provided in some embodiments of the present disclosure, when the sliding and rolling display module is in the maximum expanded state, most of the sliding and rolling connection area Q₃ is located in the maximum strain region (e.g., the lower half g₂ mentioned above) of the flexible display panel 100, and thus by controlling at least one inorganic insulating layer 13 in the display functional layer 11 and the encapsulation layer 12 to be located on the side of the first border a₁ proximate to the display area Q₁ (that is, the at least one inorganic insulating layer 13 in the display functional layer 11 and the encapsulation layer 12 does not cover the sliding and rolling connection area Q₃), the thickness of the portion of the inorganic insulating layer 13 covering the maximum strain region may be reduced as much as possible without affecting the display effect of the flexible display panel 100, so that the elastic modulus of the portion of the inorganic insulating layer 13 located in the maximum strain region may be reduced, and the portion of the inorganic insulating layer 13 located in the maximum strain region may be prevented from breaking due to pulling as much as possible. As a result, it is helpful to ameliorate the problems of the encapsulation failure, the rapid invasion of moisture and oxygen and the easy peeling of the light-emitting layer, so that the black screen of the flexible display panel 100 is not prone to occur during the display period. That is, the probability of occurrence of the display failure of the entire flexible display panel 100 is reduced.

Figure 5:
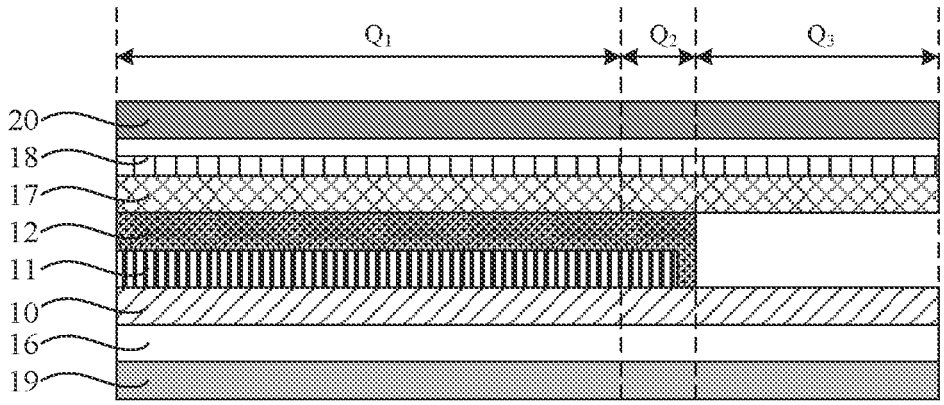
FIG. 5 is a diagram showing a sectional structure of a flexible display panel, in accordance with some embodiments of the present disclosure.

In some embodiments, referring to FIG. 5, the base substrate 10 further covers the sliding and rolling connection area Q₃.

With this design, since at least one inorganic insulating layer 13 does not cover the sliding and rolling connection area Q₃, by controlling the base substrate 10 to cover the sliding and rolling connection area Q₃, it is possible to avoid a large level difference generated between the bezel area Q₂ and the sliding and rolling connection area Q₃, thereby preventing problems of peeling and air bubbles from occurring.

In some embodiments, referring to FIGS. 6 to 10, the base substrate 10 covers only the display area Q₁ and the bezel area Q₂. On this basis, the flexible display panel 100 further includes a level difference filling layer 15.

The level difference filling layer 15 is contiguous with both of the base substrate 10 and the encapsulation layer 12, and the level difference filling layer 15 covers the sliding and rolling connection area Q₃.

In these embodiments, since the base substrate 10 and at least one inorganic insulating layer 13 in the display functional layer 11 and the encapsulation layer 12 do not cover the sliding and rolling connection area Q₃, by providing the level difference filling layer 15 contiguous with both of the base substrate 10 and the encapsulation layer 12, it is possible to avoid the large level difference generated between the bezel area Q₂ and the sliding and rolling connection area Q₃, thereby preventing the problems of the peeling and the air bubbles from occurring; furthermore, it is possible to reduce an area of the base substrate 10, thereby saving a space for layout on a large sheet of glass in a process of manufacturing the flexible display panel 100.

In some embodiments, with continued reference to FIGS. 5 to 11, the flexible display panel 100 further includes a back film 16, a polarizer 17 and an optical adhesive layer 18.

The back film 16 is located on a side of the base substrate 10 away from the display functional layer 11, and the back film 16 covers at least the display area Q₁ and the bezel area Q₂.

The polarizer 17 is located on a side of the display functional layer 11 and the encapsulation layer 12 away from the base substrate 10, and the polarizer 17 covers at least the display area Q₁ and the bezel area Q₂.

The optical adhesive layer 18 is located on a side of the polarizer 17 away from the display functional layer 11 and the encapsulation layer 12, and the optical adhesive layer 18 covers at least the display area $Q_1$ and the bezel area $Q_2$.

In some examples, a material of the back film 16 includes at least one of polyethylene naphthalate (PEN), polycarbonate (PC), PET and PI.

In some examples, a material of the polarizer 17 includes at least one of polyvinyl alcohol (PVA) and polymethyl methacrylate (PMMA).

In some examples, a material of the optical adhesive layer 18 includes at least one of polyurethane (PU) adhesive, acrylic-based adhesive and silicone.

On this basis, for example, with continued reference to FIGS. 5 to 11, the flexible display panel 100 further includes a supporting member 19 and a protective cover plate 20.

The supporting member 19 is located on a side of the back film 16 away from the base substrate 10, and the supporting member 19 covers the display area $Q_1$, the bezel area $Q_2$ and the sliding and rolling connection area $Q_3$.

The protective cover plate 20 is located on a side of the optical adhesive layer 18 away from the polarizer 17, and the protective cover plate 20 covers the display area $Q_1$, the bezel area $Q_2$ and the sliding and rolling connection area $Q_3$.

In some examples, the supporting member 19 may be formed by at least one rigid material layer and at least one flexible material layer that are arranged in a stack. With this design, it is possible to provide both of a supporting function and a bending function.

In some examples, a material of the protective cover plate 20 includes glass.

It is worth noting that in the flexible display panel, an arrangement manner of the base substrate 10, the back film 16, the polarizer 17, the optical adhesive layer 18 and the level difference filling layer 15 varies, for example, which includes, but is not limited to, the following examples.

In some examples, referring to FIG. 5, the base substrate 10 further covers the sliding and rolling connection area $Q_3$, and the back film 16, the polarizer 17 and the optical adhesive layer 18 all cover the sliding and rolling connection area $Q_3$. In this case, a distance between the base substrate 10 and the polarizer 17 is relatively small, so that it is not easy to generate a large level difference between the bezel area $Q_2$ and the sliding and rolling connection area $Q_3$. As a result, it is not prone to occur the problems of the peeling and the air bubbles even if the level difference filling layer 15 is not provided in the flexible display panel 100.

Figure 6:
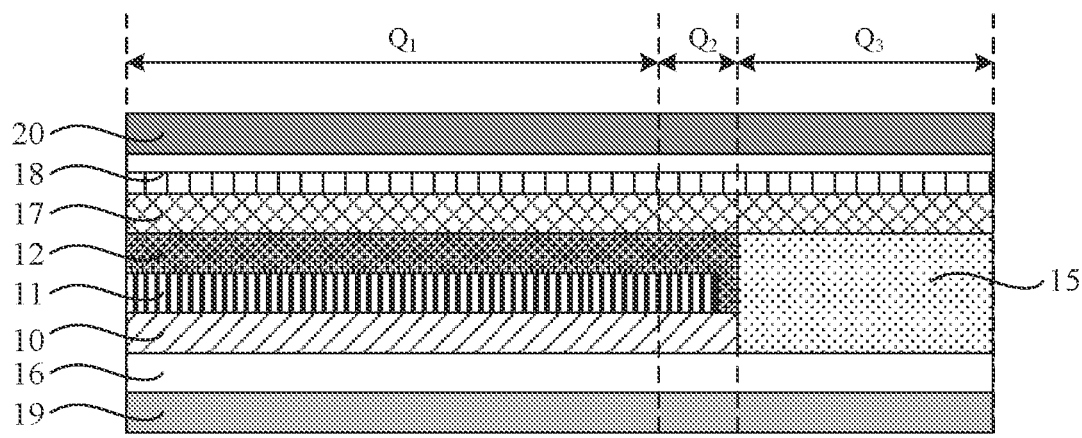
FIG. 6 is a diagram showing a sectional structure of another flexible display panel, in accordance with some embodiments of the present disclosure.

In other examples, referring to FIG. 6, the base substrate 10 does not cover the sliding and rolling connection area $Q_3$, and the back film 16, the polarizer 17 and the optical adhesive layer 18 all cover the sliding and rolling connection area $Q_3$. In this case, the level difference filling layer 15 may be provided to be contiguous with both of the base substrate 10 and the encapsulation layer 12 to prevent the large level difference from generating between the bezel area $Q_2$ and the sliding and rolling connection area $Q_3$, thereby preventing the problems of the peeling and the air bubbles from occurring.

Figure 7:
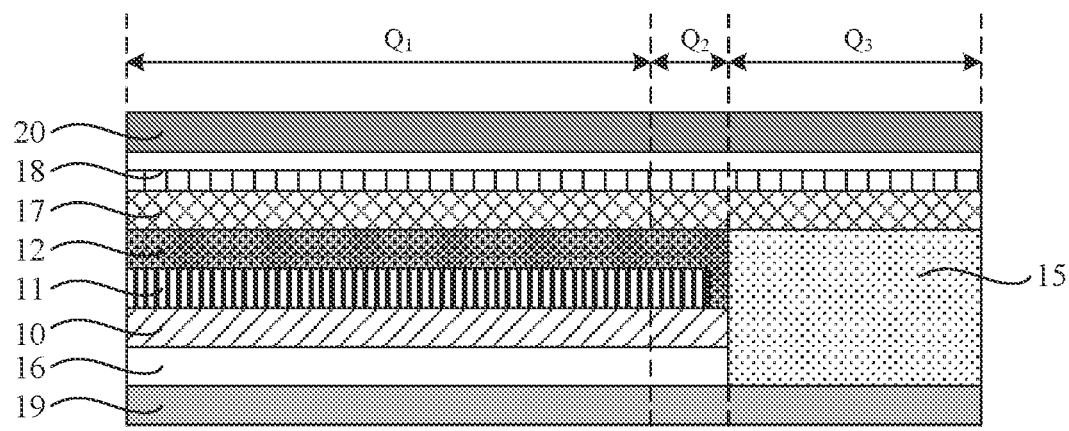
FIG. 7 is a diagram showing a sectional structure of yet another flexible display panel, in accordance with some embodiments of the present disclosure.

In yet other examples, referring to FIG. 7, neither the base substrate 10 nor the back film 16 covers the sliding and rolling connection area $Q_3$; the polarizer 17 and the optical adhesive layer 18 both cover the sliding and rolling connection area $Q_3$. In this case, the level difference filling layer 15 may be provided to be contiguous with all of the back film 16, the base substrate 10 and the encapsulation layer 12 to prevent the large level difference from generating between the bezel area $Q_2$ and the sliding and rolling connection area $Q_3$, thereby preventing the problems of the peeling and the air bubbles from occurring.

Figure 8:
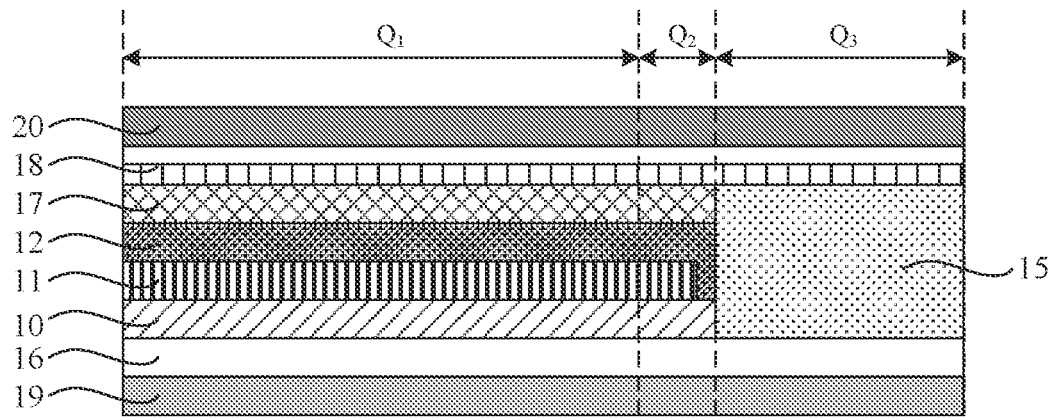
FIG. 8 is a diagram showing a sectional structure of yet another flexible display panel, in accordance with some embodiments of the present disclosure.

In yet other examples, referring to FIG. 8, neither the base substrate 10 nor the polarizer 17 covers the sliding and rolling connection area $Q_3$; the back film 16 and the optical adhesive layer 18 both cover the sliding and rolling connection area $Q_3$. In this case, the level difference filling layer 15 may be provided to be contiguous with all of the base substrate 10, the encapsulation layer 12 and the polarizer 17 to prevent the large level difference from generating between the bezel area $Q_2$ and the sliding and rolling connection area $Q_3$, thereby preventing the problems of the peeling and the air bubbles from occurring.

Figure 9:
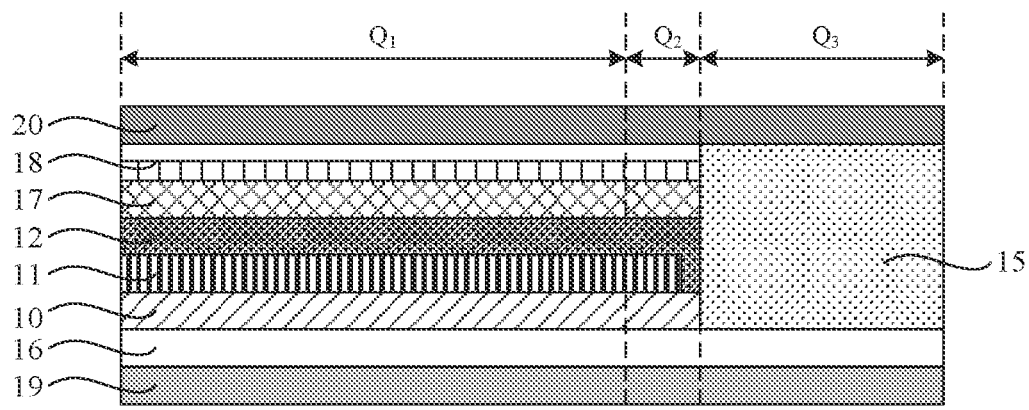
FIG. 9 is a diagram showing a sectional structure of yet another flexible display panel, in accordance with some embodiments of the present disclosure.

On this basis, for example, referring to FIG. 9, none of the base substrate 10, the polarizer 17 and the optical adhesive layer 18 covers the sliding and rolling connection area $Q_3$, and the back film 16 covers the sliding and rolling connection area $Q_3$. In this case, the level difference filling layer 15 may be provided to be contiguous with all of the base substrate 10, the encapsulation layer 12, the polarizer 17 and the optical adhesive layer 18 to prevent the large level difference from generating between the bezel area $Q_2$ and the sliding and rolling connection area $Q_3$, thereby preventing the problems of the peeling and the air bubbles from occurring.

Figure 10:
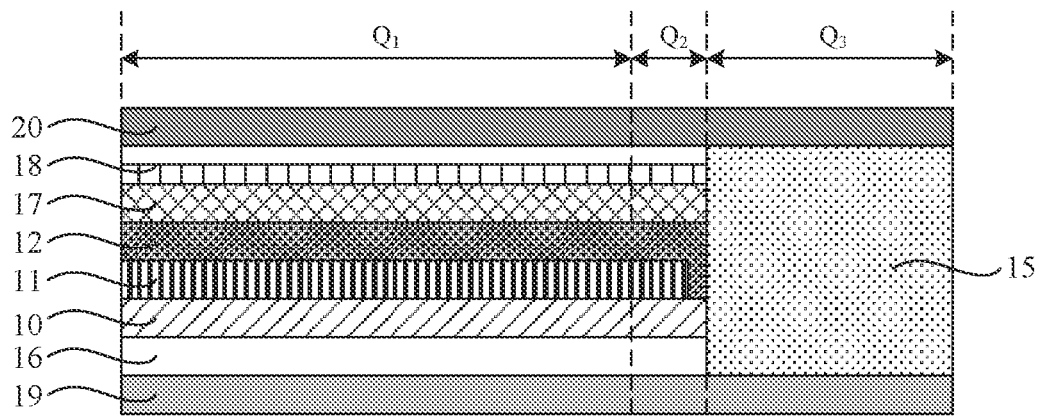
FIG. 10 is a diagram showing a sectional structure of yet another flexible display panel, in accordance with some embodiments of the present disclosure.

In yet other examples, referring to FIG. 10, none of the base substrate 10, the back film 16, the polarizer 17 and the optical adhesive layer 18 covers the sliding and rolling connection area $Q_3$. In this case, the level difference filling layer 15 may be provided to be contiguous with all of the base substrate 10, the encapsulation layer 12, the back film 16, the polarizer 17 and the optical adhesive layer 18 to prevent the large level difference from generating between the bezel area $Q_2$ and the sliding and rolling connection area $Q_3$, thereby preventing the problems of the peeling and the air bubbles from occurring.

It will be noted that the phrase "contiguous with" may refer to that the level difference filling layer 15 is in complete contact with a border of at least one of the base substrate 10, the encapsulation layer 12, the back film 16, the polarizer 17 and the optical adhesive layer 18; or the level difference filling layer 15 is in partial contact with the border of at least one of the base substrate 10, the encapsulation layer 12, the back film 16, the polarizer 17 and the optical adhesive layer 18; or there is a distance between the level difference filling layer 15 and the border of at least one of the base substrate 10, the encapsulation layer 12, the back film 16, the polarizer 17 and the optical adhesive layer 18. For example, the distance may be within 0.1 mm.

When a side of at least one of the base substrate 10, the encapsulation layer 12, the back film 16, the polarizer 17 and the optical adhesive layer 18 is coated with a material of the level difference filling layer 15, a certain gap is left, and the material of the level difference filling layer 15 may fill the gap or leave a certain blank region before it is completely cured. Therefore, the phrase "contiguous with" in some embodiments of the present disclosure includes at least the several exemplary situations mentioned above.

Figure 11:
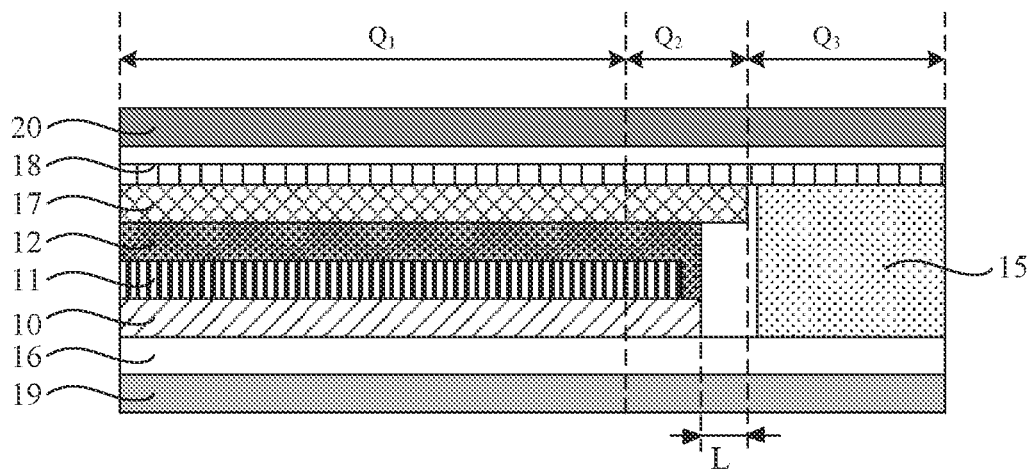
FIG. 11 is a diagram showing a sectional structure of yet another flexible display panel, in accordance with some embodiments of the present disclosure.

In some examples, referring to FIG. 11, the base substrate 10 does not cover the sliding and rolling connection area $Q_3$, the back film 16 and the optical adhesive layer 18 both cover the sliding and rolling connection area $Q_3$, and the polarizer 17 covers the display area $Q_1$ and the bezel area $Q_2$. In this case, the level difference filling layer 15 may be provided with a distance from the border of each of the base substrate 10, the encapsulation layer 12 and the polarizer 17, so as to prevent the large level difference from generating between the bezel area $Q_2$ and the sliding and rolling connection area $Q_3$, thereby preventing the problems of the peeling and the air bubbles from occurring. For example, with continued reference to FIG. 11, in the bezel area $Q_2$, a distance between the border of the polarizer 17 and the border of the encapsulation layer 12 is about 0.25 mm, and/or a distance between the border of the polarizer 17 and the border of the base substrate 10 is about 0.25 mm. In this case, the distance between the level difference filling layer 15 and the border of each of the base substrate 10 and the encapsulation layer 12 is greater than the distance between the level difference filling layer 15 and the border of the polarizer 17.

It will be understood that the above description are merely some examples of the flexible display panel 100 provided in the present disclosure. That is, the base substrate 10, the back film 16, the polarizer 17, the optical adhesive layer 18 and the level difference filling layer 15 may be adjusted according to actual situations. For example, in a case where at least two adjacent film layers of the base substrate 10, the back film 16, the polarizer 17 and the optical adhesive layer 18 do not cover the sliding and rolling connection area $Q_3$, a level difference filling layer 15 contiguous with the at least two adjacent film layers may be provided to prevent the large level difference from generating between the bezel area $Q_2$ and the sliding and rolling connection area $Q_3$, thereby preventing the problems of the peeling and the air bubbles from occurring.

It will be noted that a situation that the large level difference is generated between the bezel area $Q_2$ and the sliding and rolling connection area $Q_3$ may refer to that a degree of an influence of this level difference exceeds a level difference absorption capacity of the optical adhesive layer 18. For example, in a case where a total thickness of all film layers separate from each other is greater than 10% of a thickness of the optical adhesive layer 18, the large level difference will be generated.

Alternatively, the situation that the large level difference is generated between the bezel area $Q_2$ and the sliding and rolling connection area $Q_3$ may refer to that a height of the level difference is greater than or equal to 15 µm.

In some embodiments, an elastic modulus of the level difference filling layer 15 is less than an elastic modulus of all film layer structures, as a whole, contiguous with a side of the level difference filling layer 15 proximate to the display area.

In these embodiments, by controlling the elastic modulus of the level difference filling layer 15 to be less than the elastic modulus of all film layer structures contiguous therewith as a whole, rebound force of a side of the sliding and rolling connection area $Q_3$ away from the bezel area $Q_2$ (i.e., an end of the flexible display panel 100) may be reduced, so that a probability of the end tilting up is reduced when the sliding and rolling display module is in the maximum expanded state.

For example, the level difference filling layer 15 includes at least one layer of optical adhesive.

For example, the level difference filling layer 15 further includes at least one layer of organic plastic such as at least one of a PI layer, a polyethylene (PE) layer, a polypropylene (PP) layer and a PET layer.

Figure 12:
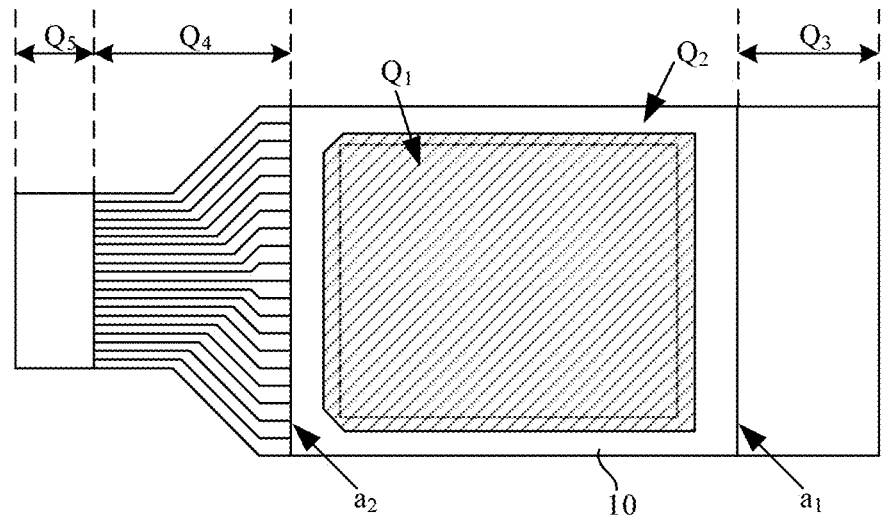
FIG. 12 is a top view of another flexible display panel, in accordance with some embodiments of the present disclosure.

In some embodiments, referring to FIG. 12, the flexible display panel 100 further has a fan-out area $Q_4$ and a bonding area $Q_5$.

The fan-out area $Q_4$ is connected to a second border $a_2$ of the bezel area $Q_2$ away from the sliding and rolling connection area $Q_3$, and the second border $a_2$ is opposite to the first border $a_1$.

The bonding area $Q_5$ is connected to a border of the fan-out area $Q_4$ away from the bezel area $Q_2$.

For example, a width of the fan-out area $Q_4$ in a direction perpendicular to the second border $a_2$ and parallel to a plane where the base substrate 10 is located is approximately 15 mm. Here, the phrase "approximately" may refer to that, for example, the width may be any value that varies within fifteen percent of the stated value (i.e., 15 mm) based on the stated value.

In some examples, the circuit structure layer 110 further includes a plurality of fan-out lead lines located in the fan-out area $Q_4$ and a plurality of bonding pins located in the bonding area $Q_5$.

For example, a bonding pin is connected to a fan-out lead line.

Figure 13:
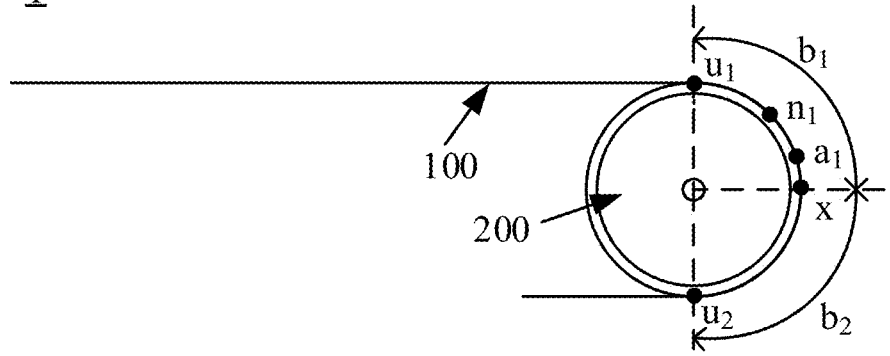
FIG. 13 is a diagram showing a sectional structure of a partial structure of a sliding and rolling display apparatus, in accordance with some embodiments of the present disclosure.

Referring to FIG. 13, some embodiments of the present disclosure provide a sliding and rolling display apparatus 1. The sliding and rolling display apparatus 1 includes a first sliding and rolling shaft 200 and the flexible display panel 100 as described in any one of the above embodiments.

The flexible display panel 100 is wound on a portion of the first sliding and rolling shaft 200 in a direction perpendicular to the first border at; when the flexible display panel 100 is in the maximum expanded state, at least a portion, in the sliding and rolling connection area $Q_3$, of the flexible display panel 100 located is in contact with the first sliding and rolling shaft 200.

The flexible display panel 100 in some of the above embodiments has at least the same beneficial effects as the flexible display panel 100 provided in any one of the foregoing embodiments, and details will not be repeated here.

In some embodiments, with continued reference to FIG. 13, when the flexible display panel 100 is in the maximum expanded state, a surface of the first sliding and rolling shaft 200 wrapped by the flexible display panel 100 includes a first cambered surface $b_1$ and a second cambered surface $b_2$ that are connected to each other in a circumferential direction of the first sliding and rolling shaft 200, the first cambered surface $b_1$ is closer to the display area $Q_1$ of the flexible display panel 100 than the second cambered surface $b_2$, and a radian of the first cambered surface $b_1$ is less than or equal to a radian of the second cambered surface $b_2$.

When the flexible display panel 100 is in the maximum expanded state, an orthogonal projection of the first border $a_1$ of the bezel area $Q_2$ on a circumferential surface of the first sliding and rolling shaft 200 is located in the first cambered surface $b_1$. Here, the circumferential surface refers to a peripheral surface of the first sliding and rolling shaft 200 in the circumferential direction thereof.

It will be noted that the "surface of the first sliding and rolling shaft 200 wrapped by the flexible display panel 100" may be, for example, as shown in FIG. 13, a surface between an upper point of tangency $u_1$ tangent to the flexible display panel 100 and a lower point of tangency $u_2$ tangent to the flexible display panel 100 in the first sliding and rolling shaft 200.

In some examples, the radian of the first cambered surface $b_1$ is equal to the radian of the second cambered surface $b_2$.

In some of the above embodiments, by controlling the orthogonal projection of the first border $a_1$ of the bezel area $Q_2$ on the circumferential surface of the first sliding and rolling shaft 200 to be located in the first cambered surface $b_1$, the first border $a_1$ may be prevented from being located in the maximum strain region. On this basis, at least one inorganic insulating layer 13 of the flexible display panel 100 does not cover the sliding and rolling connection area $Q_3$. With this arrangement, the inorganic insulating layer(s) 13 may be prevented from covering the maximum strain region, which may prevent the portion of the at least one inorganic insulating layer 13 located in the maximum strain region from breaking and may avoid the encapsulation failure. As a result, it is possible to avoid the peeling phenomenon of the light-emitting layer caused by the rapid invasion of moisture and oxygen, so that the display failure of the entire flexible display panel 100 such as the black screen is not prone to occur. In addition, when the sliding and rolling display apparatus 1 is dropped to cause a touchdown of a top end x of the first sliding and rolling shaft 200 as shown in FIG. 13, since an edge of the inorganic insulating layer 13 is located in the first cambered surface $b_1$, it is also possible to prevent the inorganic insulating layer 13, when the touchdown is happened, from being deformed so as to affect a portion of the at least one inorganic insulating layer 13 in other areas, thereby reducing a probability of the encapsulation failure due to the falling of the sliding and rolling display apparatus 1.

For example, as shown in FIG. 13, the top end x is located at a boundary between the first cambered surface $b_1$ and the second cambered surface $b_2$.

In some embodiments, when the flexible display panel 100 is in the maximum expanded state, an orthogonal projection of a border $n_1$, proximate to the first border $a_1$, of the display area $Q_1$ on the circumferential surface of the first sliding and rolling shaft 200 is located in the first cambered surface $b_1$. In this way, it is conducive to increasing an area of the display.

Figure 14:
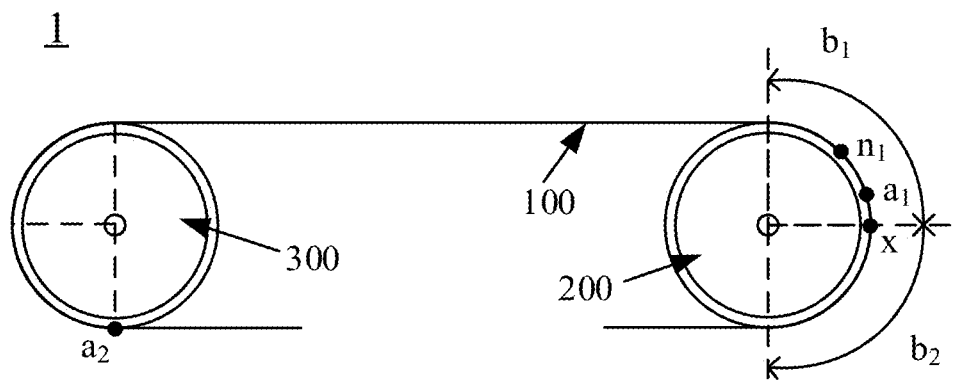
FIG. 14 is a diagram showing a sectional structure of a partial structure of another sliding and rolling display apparatus, in accordance with some embodiments of the present disclosure.

In some embodiments, referring to FIG. 14, the sliding and rolling display apparatus 1 further includes a fixed shaft 300.

The fixed shaft 300 is parallel to the first sliding and rolling shaft 200, and the flexible display panel 100 is wound and fixed on a portion of the fixed shaft 300 in the direction perpendicular to the first border $a_1$.

On this basis, the flexible display panel 100 further has the fan-out area $Q_4$ connected to the second border $a_2$ of the bezel area $Q_2$ away from the sliding and rolling connection area $Q_3$. At least a portion, located in the fan-out area $Q_4$, of the flexible display panel 100 is in contact with the fixed shaft 300.

For example, all portions, located in the fan-out area $Q_4$, of the flexible display panel 100 is in contact with the fixed shaft 300. In this way, it is conducive to increasing the area of the display.

Figure 15:
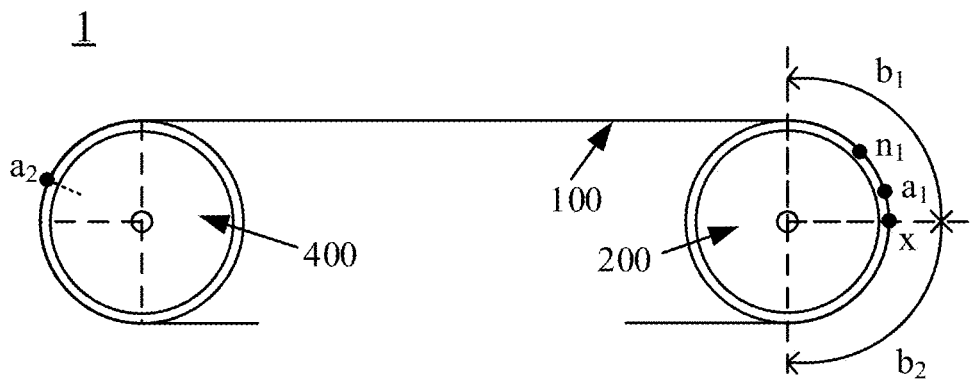
FIG. 15 is a diagram showing a sectional structure of a partial structure of yet another sliding and rolling display apparatus, in accordance with some embodiments of the present disclosure.

In some embodiments, referring to FIG. 15, the sliding and rolling display apparatus 1 further includes a second sliding and rolling shaft 400.

The second sliding and rolling shaft 400 is parallel to the first sliding and rolling shaft 200, and the flexible display panel 100 is wound on a portion of the second sliding and rolling shaft 400 in the direction perpendicular to the first border $a_1$.

The flexible display panel 100 further has the fan-out area $Q_4$ connected to the second border $a_2$ of the bezel area $Q_2$ away from the sliding and rolling connection area $Q_3$. When the flexible display panel 100 is in the maximum expanded state, at least a portion, located in the fan-out area $Q_4$, of the flexible display panel 100 is in contact with the second sliding and rolling shaft 400.

For example, all portions, located in the fan-out area $Q_4$, of the flexible display panel 100 is in contact with the second sliding and rolling shaft 400. In this way, it is conducive to increasing the area of the display.

Figure 16:
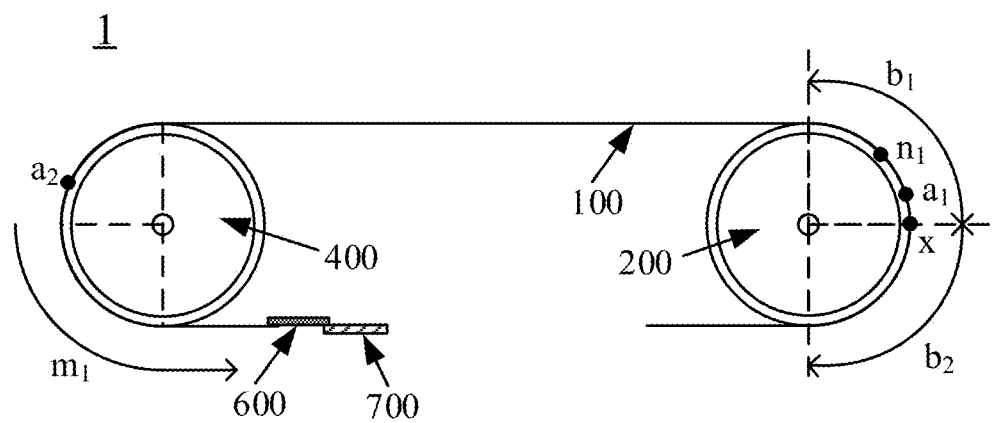
FIG. 16 is a diagram showing a sectional structure of a partial structure of yet another sliding and rolling display apparatus, in accordance with some embodiments of the present disclosure.

In some embodiments, referring to FIG. 16, the flexible display panel 100 further has the bonding area $Q_5$ connected to the border of the fan-out area $Q_4$ away from the bezel area $Q_2$.

The sliding and rolling display apparatus 1 further includes a first circuit board 600 bonded to the bonding area $Q_5$ and a second circuit board 700 bonded to the first circuit board 600.

In some examples, the first circuit board 600 may be a flexible circuit board.

In some examples, the second circuit board 700 may be a flexible circuit board or a rigid printed circuit board.

On this basis, for example, the sliding and rolling display apparatus 1 further includes a source driver, and the source driver is used to output data signals. The source driver may be disposed on the base substrate 10. Alternatively, the source driver may be disposed on the first circuit board 600.

In some examples, a structure of the flexible display panel 100 located in the bonding area $Q_5$ is in a bent state. In this way, it is conducive to reducing a space occupied by the structure of the flexible display panel 100 located in the bonding area $Q_5$.

In some embodiments, the first circuit board 600 and/or the second circuit board 700 is in a bent state, which is conducive to reducing a space occupied by the first circuit board 600 and/or the second circuit board 700.

In some embodiments, referring to FIG. 16, a dimension of the structure of the flexible display panel 100 located in the bonding area $Q_5$, the first circuit board 600 and the second circuit board 700, as a whole, in a direction mi perpendicular to the second border $a_2$ and parallel to the plane where the base substrate 10 is located is approximately 10 mm. Here, the phrase "approximately" may refer to that, for example, the dimension may be any value that varies within fifteen percent of the stated value (i.e., 10 mm) based on the stated value.

Figure 17:
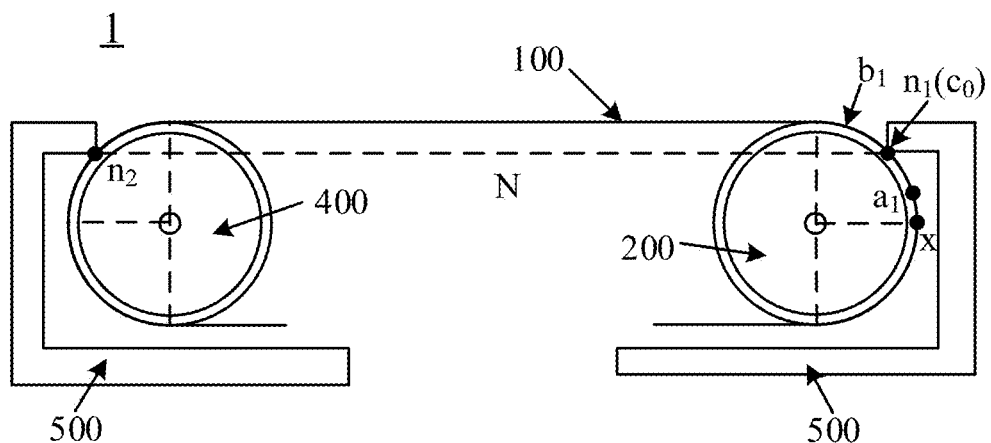
FIG. 17 is a diagram showing a sectional structure of a partial structure of yet another sliding and rolling display apparatus, in accordance with some embodiments of the present disclosure.

In some embodiments, referring to FIG. 17, $n_2$ represents a border of the display area $Q_1$ away from the first border $a_1$, and the sliding and rolling display apparatus 1 further includes a frame 500.

As shown in FIG. 17, the frame 500 is located on a non-display side N of the flexible display panel 100; when the flexible display panel 100 is in the maximum expanded state, the frame 500 covers at least a structure, located in both of the sliding and rolling connection area $Q_3$ and the bezel area $Q_2$, of the flexible display panel 100.

In some examples, the frame 500 covers only the structure, located in both of the sliding and rolling connection area $Q_3$, of the flexible display panel 100 and the bezel area $Q_2$. In this way, the frame 500 does not cover the display area $Q_1$, which may improve the economy of manufacturing the sliding and rolling display apparatus 1 on the premise of ensuring the display effect.

In other examples, the flexible display panel 100 further has the bonding area $Q_5$ connected to the border of the fan-out area $Q_4$ away from the bezel area $Q_2$.

The frame 500 covers at least a structure, located in all of the bezel area $Q_2$, the sliding and rolling connection area $Q_3$, the fan-out area $Q_4$ and the bonding area $Q_5$, of the flexible display panel 100.

The frame 500 may cover only the structure, located in all of the bezel area $Q_2$, the sliding and rolling connection area $Q_3$, the fan-out area $Q_4$ and the bonding area $Q_5$, of the flexible display panel 100. In this way, the frame 500 does not cover the display area $Q_1$, which may improve the economy of manufacturing the sliding and rolling display apparatus 1 on the premise of ensuring the display effect.

In some embodiments, referring to FIG. 17, an edge of the frame 500 proximate to the display area of the sliding and rolling display apparatus 1 includes a first edge $c_0$ parallel to an axis of the first sliding and rolling shaft 200, and an orthographic projection of the first edge $c_0$ on the circumferential surface of the first sliding and rolling shaft 200 is located in the first cambered surface $b_1$.

Figure 18:
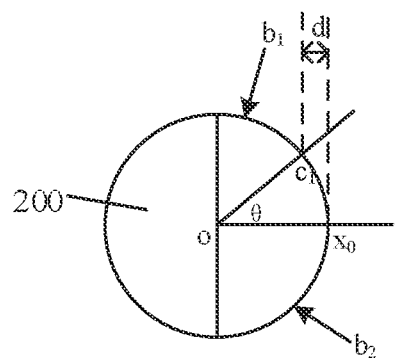
FIG. 18 is a schematic diagram of a contributing portion, in accordance with some embodiments of the present disclosure.

In this case, as shown in FIG. 18, a calculation formula of a width d of a contributing portion (i.e., a portion of a display side of the flexible display panel 100 that is covered due to wrapping of the frame 500) of the flexible display panel 100 is as follows:

$$d = R(1 - \cos\theta)$$

where R is a radius of an cross section, in mm;
θ is an included angle formed by the straight line $oc_1$ and the straight line ox, and θ is in a range from 0° to 90°;
the point o is a center of a circle of the cross section of the first sliding and rolling shaft 200;
the point $x_0$ is a top point, on the cross section, corresponding to the top end x of the first sliding and rolling shaft 200; and
the point $c_1$ is a point of intersection between the orthographic projection of the first edge $c_0$ of the frame 500 on the circumferential surface of the first sliding and rolling shaft 200 and the cross section of the first sliding and rolling shaft 200.

In some examples, θ is in a range from 30° to 45°.

For example, the width d of the contributing portion is less than or equal to 1 mm (d≤1 mm).

For example, R is 4 mm, θ is 30°, and d is approximately 0.536 mm.

Here, it will be noted that, a calculation mode of a width d of a contributing portion of the fixed shaft 300 or the second sliding and rolling shaft 400 is similar to the above mode, and details will not be repeated here.

In some of the above examples, the overall display effect of the sliding and rolling display apparatus 1 may be ensured by limiting the width of the contributing portion.

It will be noted that the sliding and rolling display apparatus 1 may be any apparatus that displays text or images whether in motion (e.g., a video) or stationary (e.g., a still image). More specifically, it is anticipated that the embodiments may be implemented in a variety of electronic apparatuses or associated with a variety of electronic apparatuses. For example, the variety of electronic apparatuses include (but are not limited to): mobile phones, wireless apparatuses, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

Figure 19:
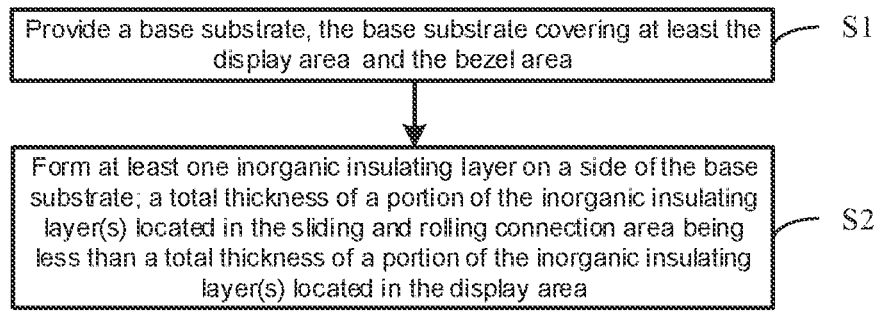
FIG. 19 is a flow diagram of a method of manufacturing a flexible display panel, in accordance with some embodiments of the present disclosure.

Some embodiments of the present disclosure further provide a method of manufacturing a flexible display panel. Referring to FIGS. 2, and 5 to 11, the flexible display panel 100 has a display area $Q_1$, a bezel area $Q_2$ disposed around the display area $Q_1$ and a sliding and rolling connection area $Q_3$ connected to a first border of the bezel area $Q_2$ away from the display area $Q_1$. Referring to FIG. 19, the method includes S1 to S2.

In S1, a base substrate 10 is provided, and the base substrate 10 covers at least the display area $Q_1$ and the bezel area $Q_2$.

In S2, at least one inorganic insulating layer 13 is formed on a side of the base substrate 10; a total thickness of a portion of the inorganic insulating layer(s) 13 located in the sliding and rolling connection area $Q_3$ is less than a total thickness of a portion of the inorganic insulating layer(s) 13 located in the display area $Q_1$.

The method of manufacturing the flexible display panel 100 in some of the above embodiments is used to manufacture the flexible display panel 100 provided in any one of the foregoing embodiments. In the flexible display panel 100 manufactured by the method, by controlling the thickness of the portion of the at least one inorganic insulating layer 13 located in the sliding and rolling connection area $Q_3$ to be less than the thickness of the portion of the at least one inorganic insulating layer 13 located in the display area $Q_1$, a thickness of a portion of the at least one inorganic insulating layer 13 covering the maximum strain region may be reduced as much as possible without affecting the display effect of the flexible display panel 100, so that the portion of the at least one inorganic insulating layer 13 located in the maximum strain region may be prevented from breaking as much as possible. As a result, it is possible to ameliorate the problems of the encapsulation failure, the rapid invasion of moisture and oxygen and the easy peeling of the light-emitting layer, so that the black screen of the flexible display panel 100 is not prone to occur during the display period. That is, the probability of occurrence of the display failure of the entire flexible display panel 100 is reduced.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A flexible display panel, having a display area, a bezel area disposed around the display area and a sliding and rolling connection area connected to a first border of the bezel area away from the display area;
the flexible display panel comprising:
a base substrate covering at least the display area and the bezel area;
one or more inorganic insulating layers located on a side of the base substrate, wherein a total thickness of a portion of the one or more inorganic insulating layers located in the sliding and rolling connection area is less than a total thickness of a portion of the one or more inorganic insulating layers located in the display area;
a display functional layer located on the side of the base substrate; and
an encapsulation layer located on a side of the display functional layer away from the base substrate, the encapsulation layer being configured to encapsulate the display functional layer on the base substrate;
wherein the display functional layer and the encapsulation layer include at least one inorganic insulating layer of the one or more inorganic insulating layers, and the at least one inorganic insulating layer is located only on a side of the first border proximate to the display area; and the base substrate covers the display area and the bezel area without covering the sliding and rolling connection area; and the flexible display panel further comprises:

a level difference filling layer contiguous with both of the base substrate and the encapsulation layer, wherein the level difference filling layer covers the sliding and rolling connection area.

2. The flexible display panel according to claim 1, wherein
a number of layers of the portion of the one or more inorganic insulating layers located in the sliding and rolling connection area is less than a number of layers of the portion of the one or more inorganic insulating layers located in the display area.

3. The flexible display panel according to claim 2, wherein
the number of layers of the portion of the one or more inorganic insulating layers located in the sliding and rolling connection area is zero.

4. The flexible display panel according to claim 2, wherein
a total thickness of a portion of the one or more inorganic insulating layers located in the bezel area is less than or equal to the total thickness of the portion of the one or more inorganic insulating layers located in the display area, and is greater than the total thickness of the portion of the one or more inorganic insulating layers located in the sliding and rolling connection area.

5. The flexible display panel according to claim 4, wherein
a number of layers of the portion of the one or more inorganic insulating layers located in the bezel area is less than or equal to the number of layers of the portion of the one or more inorganic insulating layers located in the display area, and is greater than the number of layers of the portion of the one or more inorganic insulating layers located in the sliding and rolling connection area.

6. The flexible display panel according to claim 1, further comprising:
a back film located on a side of the base substrate away from the display functional layer, the back film covering at least the display area and the bezel area;
a polarizer located on a side of the display functional layer and the encapsulation layer away from the base substrate, the polarizer covering at least the display area and the bezel area; and
an optical adhesive layer located on a side of the polarizer away from the display functional layer and the encapsulation layer, the optical adhesive layer covering at least the display area and the bezel area.

7. The flexible display panel according to claim 6, wherein the back film covers only the display area and the bezel area; and the level difference filling layer is further contiguous with the back film; or
the back film further covers the sliding and rolling connection area; the polarizer covers only the display area and the bezel area; and the level difference filling layer is further contiguous with the polarizer.

8. The flexible display panel according to claim 6, wherein the polarizer covers only the display area and the bezel area; and the level difference filling layer is further contiguous with the polarizer.

9. The flexible display panel according to claim 8, wherein the optical adhesive layer covers only the display area and the bezel area; and
the level difference filling layer is further contiguous with the optical adhesive layer.

10. The flexible display panel according to claim 6, further comprising:
a supporting member located on a side of a back film away from the base substrate, the supporting member covering the display area, the bezel area and the sliding and rolling connection area; and
a protective cover plate located on a side of an optical adhesive layer away from a polarizer, the protective cover plate covering the display area, the bezel area and the sliding and rolling connection area.

11. The flexible display panel according to claim 1, wherein an elastic modulus of the level difference filling layer is less than an elastic modulus of all film layer structures, as a whole, contiguous with a side of the level difference filling layer proximate to the display area; or
the elastic modulus of the level difference filling layer is less than the elastic modulus of all film layer structures, as a whole, contiguous with the side of the level difference filling layer proximate to the display area; the level difference filling layer includes at least one layer of optical adhesive and/or at least one layer of organic plastic.

12. The flexible display panel according to claim 1, wherein the display functional layer includes:
a circuit structure layer located on the side of the base substrate and located on a side of the first border proximate to the display area; and
a light-emitting structure layer located on a side of the circuit structure layer away from the base substrate, the light-emitting structure layer covering at least the display area, and the light-emitting structure layer being coupled to the circuit structure layer;
wherein the circuit structure layer includes an inorganic insulating layer of the at least one inorganic insulating layer.

13. The flexible display panel according to claim 12, further comprising:
a blocking dam structure located in the bezel area and disposed around the circuit structure layer and the light-emitting structure layer;
wherein the encapsulation layer includes another inorganic insulating layer of the at least one inorganic insulating layer, and the another inorganic insulating layer covers the blocking dam structure.

14. A sliding and rolling display apparatus, comprising:
a first sliding and rolling shaft; and
the flexible display panel according to claim 1, wherein a portion of the flexible display panel is wound on a portion of the first sliding and rolling shaft in a direction perpendicular to the first border; when the flexible display panel is in a maximum expanded state, at least a portion, located in the sliding and rolling connection area, of the flexible display panel is in contact with the first sliding and rolling shaft.

15. The sliding and rolling display apparatus according to claim 14, wherein when the flexible display panel is in the maximum expanded state, a surface of the first sliding and rolling shaft wrapped by the flexible display panel includes a first cambered surface and a second cambered surface that are connected to each other in a circumferential direction of the first sliding and rolling shaft, and the first cambered surface is closer to the display area of the flexible display panel than the second cambered surface;

a radian of the first cambered surface is less than or equal to a radian of the second cambered surface;

when the flexible display panel is in the maximum expanded state, an orthogonal projection of the first border of the bezel area on a circumferential surface of the first sliding and rolling shaft is located in the first cambered surface.

16. The sliding and rolling display apparatus according to claim 15, wherein when the flexible display panel is in the maximum expanded state, an orthogonal projection of a border, proximate to the first border, of the display area on the circumferential surface of the first sliding and rolling shaft is located in the first cambered surface; and/or the radian of the first cambered surface is equal to the radian of the second cambered surface.

17. The sliding and rolling display apparatus according to claim 14, further comprising:

a fixed shaft parallel to the first sliding and rolling shaft; a portion of the flexible display panel being wound and fixed on a portion of the fixed shaft in the direction perpendicular to the first border; wherein the flexible display panel further has a fan-out area connected to a second border of the bezel area away from the sliding and rolling connection area; at least a portion, located in the fan-out area, of the flexible display panel is in contact with the fixed shaft; or further comprising:

a second sliding and rolling shaft parallel to the first sliding and rolling shaft; a portion of the flexible display panel being wound on a portion of the second sliding and rolling shaft in the direction perpendicular to the first border, wherein the flexible display panel further has a fan-out area connected to a second border of the bezel area away from the sliding and rolling connection area; when the flexible display panel is in the maximum expanded state, at least a portion, located in the fan-out area, of the flexible display panel is in contact with the second sliding and rolling shaft.

18. The sliding and rolling display apparatus according to claim 14, further comprising:

a frame located on a non-display side of the flexible display panel; wherein when the flexible display panel is in the maximum expanded state, the frame covers at least a structure, located in both of the sliding and rolling connection area and the bezel area, of the flexible display panel.

19. The flexible display panel according to claim 1, wherein the total thickness of the portion of the one or more inorganic insulating layers located in the sliding and rolling connection area is 0 μm.

20. The flexible display panel according to claim 1, further having:

a fan-out area connected to a second border of the bezel area away from the sliding and rolling connection area, the second border being opposite to the first border; and a bonding area connected to a border of the fan-out area away from the bezel area.

\* \* \* \* \*